(12) United States Patent
Yuasa (10) Patent No.: US 7,101,797 B2
(45) Date of Patent: Sep. 5, 2006

(54) SUBSTRATE PROCESSING DEVICE AND PROCESSING METHOD

(75) Inventor: Mitsuhiro Yuasa, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/652,504

(22) Filed: Sep. 2, 2003

(65) Prior Publication Data

US 2004/0040655 A1 Mar. 4, 2004

(30) Foreign Application Priority Data

Sep. 2, 2002 (JP) .............................. 2002-257200

(51) Int. Cl.
*H01L 21/302* (2006.01)
*H01L 21/301* (2006.01)

(52) U.S. Cl. ...................... 438/689; 438/706; 438/708; 438/113; 438/460; 219/121.6; 219/121.67; 219/121.68

(58) Field of Classification Search ................ 438/689, 438/706, 708; 216/37, 39, 58, 60, 65; 219/121.6, 219/121.67, 121.68, 121.69
See application file for complete search history.

(56) References Cited

U.S. PATENT DOCUMENTS

| 4,643,799 | A | * | 2/1987 | Tsujii et al. .................... 216/65 |
| 5,328,558 | A | * | 7/1994 | Kawamura ................... 438/707 |
| 5,912,186 | A | * | 6/1999 | Yoshino et al. .............. 438/708 |
| 6,368,977 | B1 | * | 4/2002 | Narita et al. ................. 438/714 |
| 2002/0170891 | A1 | * | 11/2002 | Boyle et al. ........... 219/121.67 |

FOREIGN PATENT DOCUMENTS

| JP | S59-71599 | 9/1984 |
| JP | 61-88101 | 6/1986 |
| JP | 64-034363 | 2/1989 |
| JP | 06-120334 | 4/1994 |
| JP | 06-177073 | 6/1994 |
| JP | 09-141645 | 6/1997 |
| JP | 10-034363 | 2/1998 |
| JP | 10-199826 | 7/1998 |
| JP | 10-305420 | 11/1998 |
| JP | 11-050274 | 2/1999 |
| JP | 2001-176820 | 6/2001 |
| JP | 2001-219290 | 8/2001 |
| JP | 2001-230209 | 8/2001 |
| JP | 2002-100825 | 4/2002 |
| JP | 2002-144070 | 5/2002 |

* cited by examiner

*Primary Examiner*—Hsien-Ming Lee
(74) *Attorney, Agent, or Firm*—Crowell & Moring LLP (57) ABSTRACT

In a state where a process gas including $SF_6$ and $O_2$ is supplied in a chamber, a laser light irradiator provided outside the chamber irradiates a laser light onto a substrate. At the portion of the substrate onto which the laser light is irradiated, the material that makes up the substrate is excited and converted into a gaseous substance by reacting with the process gas. The temperature of the substrate placed on a stage is kept at a predetermined temperature since a temperature adjuster supplies a chiller to a coolant flow passage provided inside the stage.

26 Claims, 6 Drawing Sheets

SUBSTRATE PROCESSING DEVICE AND PROCESSING METHOD

BACKGROUND OF THE INVENTION

1. Field of the Invention

The present invention relates to a processing device and a processing method for a substrate such as a semiconductor substrate.

2. Description of the Related Art

A method using a dicing saw which is rotated at a high speed is widely used as a method of applying some process, for example, dividing to a substrate such as a semiconductor substrate. According to this method, a substrate in a state of being adhered on an adhesive sheet is cut by a dicing saw made of a diamond blade, etc.

There is a kind of semiconductor element called MEMS (Micro Electro Mechanical System) element. The MEMS element comprises a mechanical structure which is formed on a surface of a semiconductor substrate in which circuit elements are formed. The MEMS element is used for an electronic component and a mechanical component necessary for many types of electronic systems and electronic optical systems. For example, an optical switching element having a movable cantilever can be cited as the MEMS element.

In the process of manufacturing a component comprising the MEMS element, a chip (die) of the MEMS element is cut out from a substrate by the above-described method, likewise a substrate of an ordinary element. However, a mechanical structure is exposed on the surface of the MEMS element substrate, and this causes the following problems if the above-described conventional processing method is used.

First, in case of a cutting process using a dicing saw, minute cutting dust produced from cutting stick to the mechanical structure, causing a fear that the function of the mechanical structure might be damaged. For example, if minute cutting dust enter a space between a cantilever and the surface of a substrate, the switching function of a switching element might be harmed.

Second, in order to prevent cutting dust from sticking and a substrate from being overheated, pure water is supplied, in the cutting process, to where the substrate and a dicing blade contact each other and therearound. Because of this, the mechanical structure, which is exposed on the surface of the substrate might be damaged by the flow of the water.

Third, the function of the mechanical structure might be damaged by the surface tension of the water when the water evaporates. For example, if a cantilever is stuck on the surface of a substrate, the switching function of a switching element might be damaged.

As described above, in a case where a substrate on which an MEMS element is formed is processed by utilizing the above-described conventional method, there is a danger that the mechanical structure exposed on the surface of the substrate and its function might be damaged. This might damage the reliability of substrate processing, and cause a decrease in the yield.

Problems similar to those described above happen not only when processing an MEMS element substrate, but also applying a process such as cutting to a substrate on whose surface a fine structure is formed.

SUMMARY OF THE INVENTION

In view of the above situations, an object of the present invention is to provide a substrate processing device and processing method capable of processing a substrate having a fine structure on the surface thereof with a high reliability.

Another object of the present invention is to provide a substrate processing device and processing method capable of processing a substrate having a fine structure on the surface thereof, while reducing damages on the fine structure and its function.

To achieve the above objects, a substrate processing device according to a first aspect of the present invention comprises:

a chamber;

a stage which is provided in the chamber and on which a substrate is placed;

a process gas supplier which supplies into the chamber, a process gas which reacts with a material of the substrate and thus can convert the material into a gaseous substance; and a laser light irradiator which irradiates a laser light having a predetermined wavelength to a predetermined portion of the substrate so that the material at the predetermined portion is excited and then converted into the gaseous substance by reacting with the process gas.

The substrate processing device may further comprise a pressure adjuster which adjusts a pressure inside the chamber to a pressure at which the gaseous substance can exist as a gas.

The stage may comprise a temperature adjuster which adjusts a temperature of the substrate at a predetermined temperature.

The process gas may be made up of a substance that does not absorb the laser light having the predetermined wavelength.

The substrate processing device may further comprise an inert gas supplier which supplies an inert gas into the chamber.

The stage may comprise an optical transparent layer which constitutes a placement surface on which the substrate is placed, and which permits transmission of light.

A light scattering layer that can scatter the laser light may be provided in an area of the stage where the optical transparent layer is provided.

The chamber may comprise a window constituted by a window member that permits transmission of the laser light, and the laser light irradiator may irradiate the laser light onto the substrate through the window from the outside of the chamber.

The substrate processing device may further comprise a temperature adjuster which adjusts a temperature of the window material to a predetermined temperature.

The laser light irradiator may comprise:

a light source which oscillates the laser light having the predetermined wavelength;

a laser light irradiating terminal which is connected to the light source and irradiates the laser light; and a drive unit which drives the laser light irradiating terminal in accordance with a predetermined pattern.

The laser light irradiator may irradiate the laser light having a spot shape.

The laser light irradiator may comprise a shaping unit which can shape the spot shape of the laser light.

The shaping unit may shape the spot-shaped laser light into an oval or a rectangle.

The substrate may be supported by its surface that faces the stage being adhered to a sheet material.

The substrate may be made up of a semiconductor material.

The substrate processing device may further comprise:

a transportation chamber which is connected to the chamber via a gate member that can be airtightly be opened and closed, and which comprises a transportation device for transporting the substrate into and out from the chamber; and a heating chamber which is connected to the transportation chamber and is provided for heating the substrate transported out from the chamber to a predetermined temperature.

A substrate processing method according to a second aspect of the present invention comprises:

a step of placing a substrate in a chamber;

a process gas supplying step of supplying into the chamber, a process gas that reacts with a material of the substrate and thus can convert the material into a gaseous substance; and a laser light irradiating step of irradiating a laser light having a predetermined wavelength onto a predetermined portion of the substrate, so that the material at the predetermined portion is excited and converted into the gaseous substance by reacting with the process gas.

The substrate processing method may further comprise a pressure adjusting step of adjusting a pressure inside the chamber to a pressure at which the gaseous substance can exist as a gas.

The substrate processing method may further comprise a step of adjusting a temperature of the substrate to a predetermined temperature.

In the laser light irradiating step, the laser light may be irradiated from the outside of the chamber.

The laser light irradiating step may comprise a step of moving a position that the laser light should irradiate in accordance with a predetermined pattern.

In the laser light irradiating step, a spot-shaped laser light having a spot shape which is shaped into an oval or a rectangle may be irradiated.

The substrate processing method may further comprise a step of supplying an inert gas into the chamber.

In the laser light irradiating step, at least a surface area of the substrate may be divided into a plurality of areas.

In the laser light irradiating step, the substrate may be divided into a plurality of parts.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

A substrate processing device and processing method according to an embodiment of the present invention will now be explained with reference to the drawings. In the present embodiment, a case where the present invention is applied to a dicing device and a dicing method for applying a dividing process to a semiconductor substrate, will be explained as an example.

Figure 1:
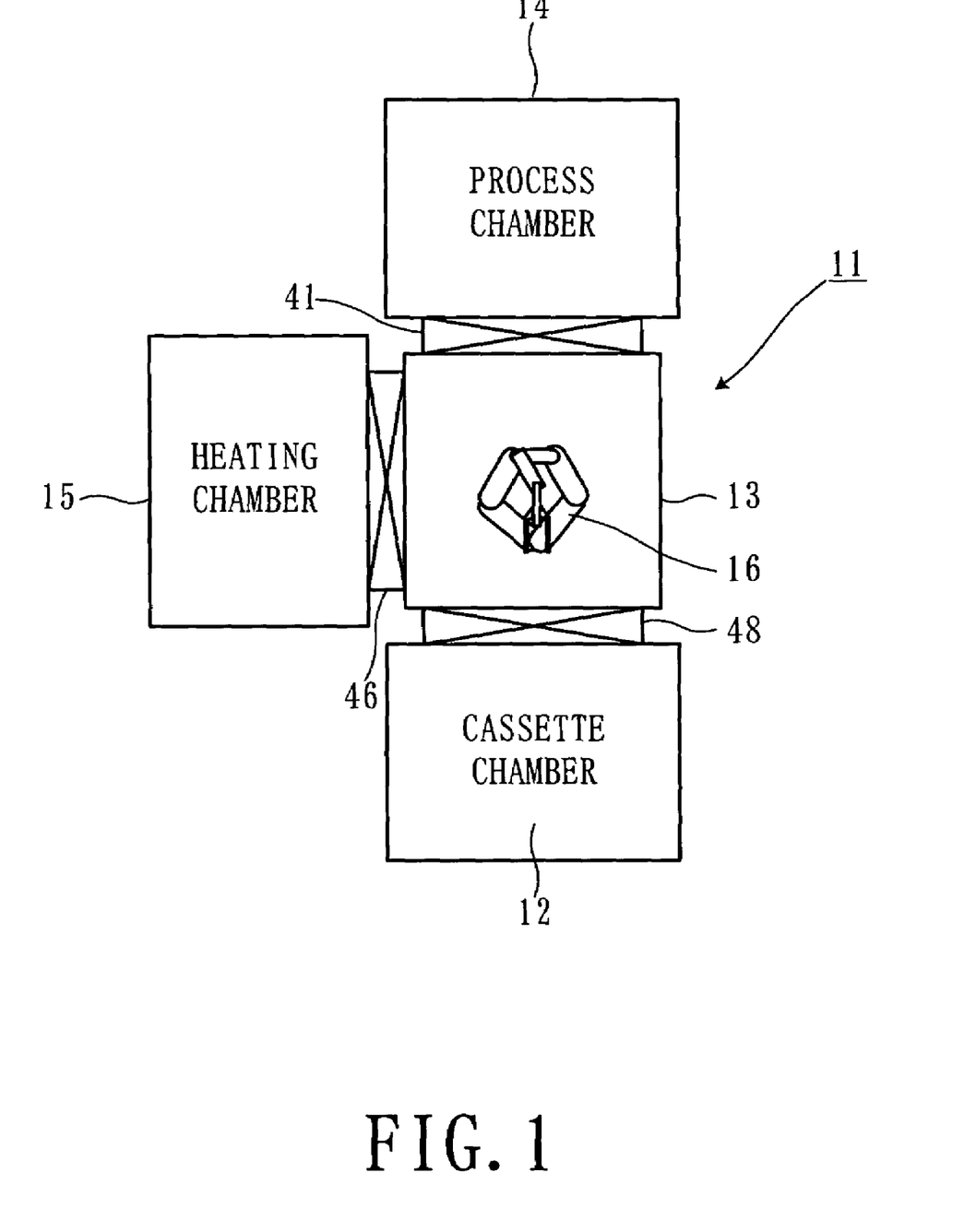
FIG. 1 is a diagram showing the structure of a processing device according to an embodiment of the present invention.

The structure of a processing device 11 according to the present embodiment is shown in FIG. 1.

As shown in FIG. 1, the processing device 11 comprises a cassette chamber 12, a transportation chamber 13, a process chamber 14, and a heating chamber 15.

The cassette chamber 12 functions as a port for transporting a cassette into and out from the processing device 11. The cassette chamber 12 has a cassette stand or the like, and is structured so that a predetermined number of cassettes can be set thereinside. A semiconductor substrate (hereinafter, referred to as process target) which is adhered to a frame by an adhesive sheet is contained in a cassette. A predetermined number of process targets are contained in a cassette. The cassette chamber 12 is structured so that its inside can be vacuumed.

The semiconductor substrate is made of a silicon single crystal substrate. A so-called MEMS (Micro Electro Mechanical System) element, for example, an optical switching element is formed on the semiconductor substrate. A fine mechanical structure of the MEMS element, for example, a movable cantilever, is formed so as to be exposed on the surface of the semiconductor substrate.

The transportation chamber 13 is connected to the cassette chamber 12, the process chamber 14, and the heating chamber 15. The transportation chamber 13 is provided with a transportation mechanism 16 having an unillustrated arm and the like. The process target is transported to and from between the chambers via the transportation chamber 13. The transportation chamber 13 is structured so that its inside can be vacuumed.

As will be described later, the process chamber 14 provides a room in which a predetermined process, according to the present embodiment in particular, a dividing process for cutting the semiconductor substrate through all its thickness, and dividing the semiconductor substrate into a predetermined number of portions (dies) is applied to the semiconductor device.

Figure 2:
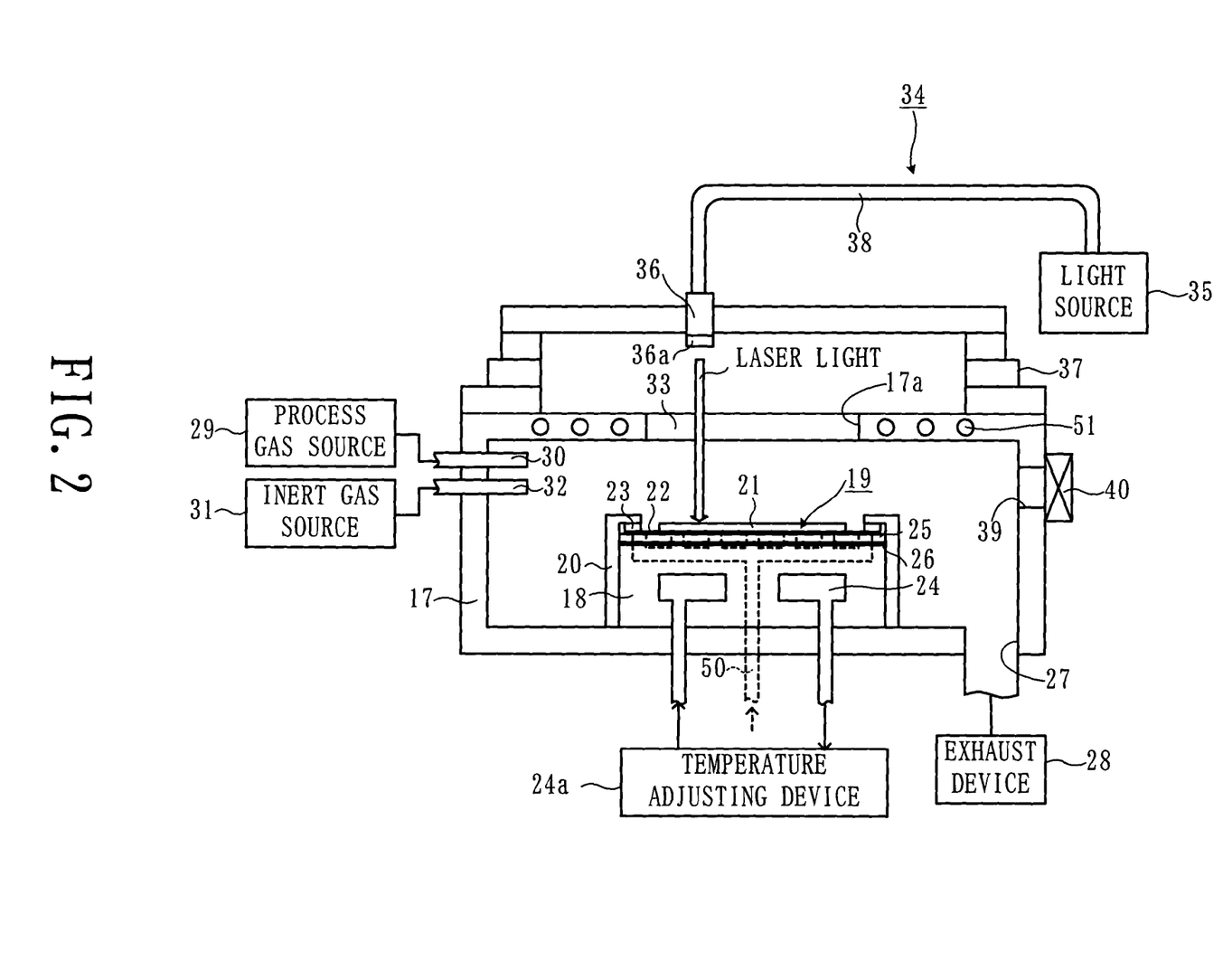
FIG. 2 is a diagram showing the structure of a process chamber.

The structure of the process chamber 14 is shown in FIG. 2. As shown in FIG. 2, the process chamber 14 comprises a container 17 which is formed into, for example, an approximately cylindrical shape. The container 17 is made of stainless steel, or aluminum.

The container 17 has a stage 18 which stands approximately vertically on the bottom of the container 17. A process target 19 is placed on the stage 18. The stage 18 has a clamp 20 therearound, which is structured so as to be elevated and dropped by an unillustrated elevation mechanism. The process target 19 is fixed on the stage 18 by the clamp 20.

As described above, the process target 19 is structured by adhering a semiconductor substrate 21 to a frame 23 by an adhesive sheet 22. The process target 19 is placed on the stage 18 so that the adhesive sheet 22 and the stage 18 face each other.

The process target 19 on the stage 18 is lifted up and down by an unillustrated lift mechanism such as a lift pin, etc.

A coolant flow passage 24 is formed inside the stage 18. An ordinary chiller is supplied to the coolant flow passage 24 by a temperature adjusting device 24a which is connected to the coolant flow passage 24. Due to this, the stage 18 and the process target 19 (semiconductor substrate 21) placed on the stage 18 are kept at a predetermined temperature. The temperature adjusting device 24a keeps the temperature of the stage 18 at, for example, approximately −50° C. during a process, by supplying a chiller to the coolant flow passage 24.

An optical transparent layer 25 that constitutes a placement surface on which the process target 19 is placed is provided on the top of the stage 18. The optical transparent layer 25 is made of a material such as quartz glass that permits transmission of light therethrough. The optical transparent layer 25 is formed to have a thickness of, for example, approximately 10 mm, and fixed on the top of the stage 18. The top surface of the optical transparent layer 25 is formed flat, and the process target 19 is placed on the top surface of the optical transparent layer 25.

The stage 18 is provided with a thermal conductive gas line 50 which communicates with the top surface of the optical transparent layer 25. An inert gas such as helium is supplied to between the process target 19 and the optical transparent layer 25 via the thermal conductive gas line 50. Due to the inert gas supplied via the thermal conductive gas line 50, thermal conduction between the process target 19 and the optical transparent layer 25 is efficiently carried out, even if the inside of the container 17 is vacuumed.

Figure 3:
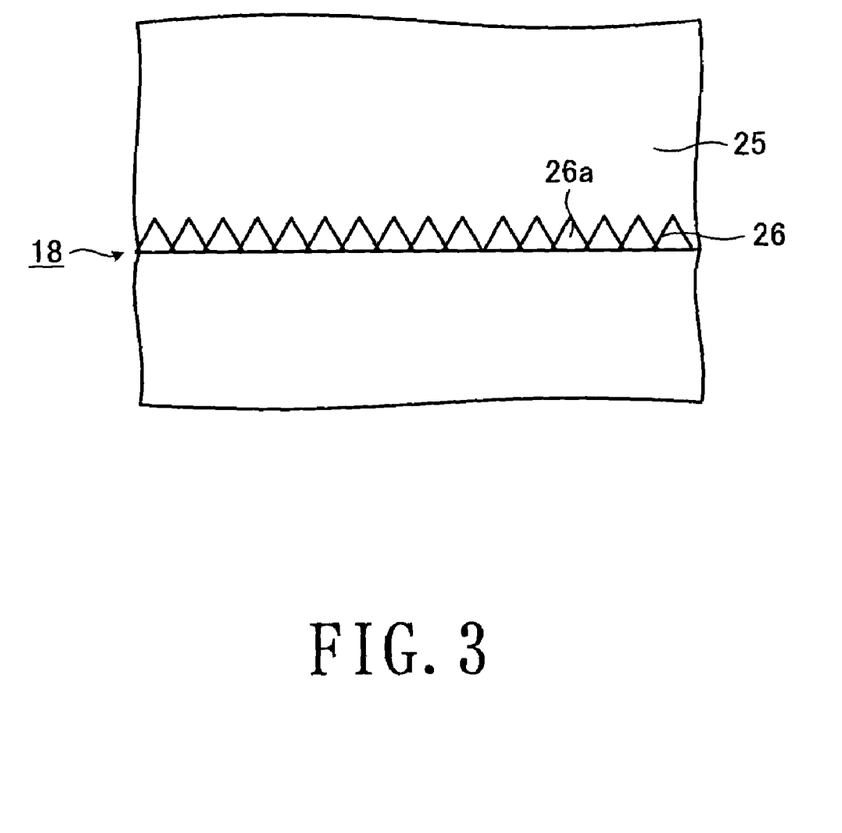
FIG. 3 is a diagram showing the structure of a light scattering portion.

A light scattering portion 26 is provided under the optical transparent layer 25. The light scattering portion 26 is made of a reflective material layer having multiple conical projections 26a, as shown in FIG. 3. The light scattering portion 26 scatters a light that transmits through the optical transparent layer 25. Each conical projection 26a is provided so that its inclined surfaces form angles of approximately ±80° with respect to the direction in which a laser light comes.

As will be described later, the optical transparent layer 25 has a function for preventing the placement surface on which the process target 19 is placed from being heated during irradiation of a laser light. The adhesive sheet 22 is made of a material that does not absorb a laser light. Because of this, in a case where a laser light cuts the semiconductor substrate 21 through all its thickness, the laser light passes through the adhesive sheet 22 thereby to be irradiated on the placement surface. However, because the laser light transmits through the optical transparent layer 25 that constitutes the placement surface, the laser light is not absorbed in the neighborhood of the placement surface. Due to this, a rise in the temperature can be avoided in the neighborhood of the placement surface, and denaturation of the adhesive sheet 22 by heat can therefore be avoided.

The laser light that transmits through the optical transparent layer 25 is scattered by the light scattering portion 26. By the laser light being scattered, the stage 18 can be prevented from being locally heated by the laser light that transmits through the optical transparent layer 25. The thermal energy in the irradiated portions that is weakened by being scattered is absorbed by the chiller circulating through the coolant flow passage 24.

An exhaust port 27 is provided in the bottom of the container 17. The exhaust port 27 is connected to an exhaust device 28. The exhaust device 28 vacuums the inside of the container 17 until a predetermined depressurized atmosphere appears. As will be described later, the pressure inside the container 17 is set at a pressure at which a substance produced by reaction of the semiconductor substrate 21 and a process gas exists as a gas, i.e. a vacuum pressure.

A process gas supply nozzle 30 which is connected to a process gas source 29 is provided to the container 17. The process gas supply nozzle 30 is provided in, for example, the side wall of the container 17. The process gas supply nozzle 30 may be provided in the ceiling of the container 17.

A process gas having reactivity with silicon that makes up the semiconductor substrate 21 is supplied from the process gas source 29. The process gas is made of a substance that produces a gas-phase substance under a predetermined pressure, by reacting with silicon which is excited by applied heat. In the present embodiment, the process gas includes sulfur hexafluoride $SF_6$ and oxygen $O_2$.

A $SF_6$ gas and an $O_2$ gas that make up the process gas are mixed beforehand and supplied into the container 17 from the one process gas supply nozzle 30. Or, these two gases are supplied into the container 17 separately from two process gas supply nozzles without being mixed together beforehand.

Further, an inert gas supply nozzle 32 that is connected to an inert gas source 31 is provided to the container 17. The inert gas supply nozzle 32 is provided in, for example, the side wall of the container 17. The inert gas supply nozzle 32 may be provided in the ceiling of the container 17.

Inert gases such as He, Ne, and nitrogen, etc. are supplied from the inert gas source 31. Inert gases to be used need to be inert at least against silicon and a reactive gas. As will be described later, inert gases are used for conducting a purge inside the container 17 after a process is carried out.

An opening 17a is provided in the ceiling of the container 17, and a top plate 33 made of a material such as quartz glass that permits transmission of light is embedded in the opening 17a. The top plate 33 and the opening 17a are sealed airtightly. The top plate 33 is provided so as to be opposed to the flat surface of the stage 18. The diameter of the top plate 33 is larger than at least the diameter of the semiconductor substrate 21.

A temperature adjusting mechanism 51 is provided around the top plate 33. The temperature adjusting mechanism 51 is constituted by, for example, a flow passage through which a temperature-adjusting medium kept at a predetermined temperature flows. The temperature of the top plate 33 is kept at a predetermined temperature by the temperature adjusting mechanism 51. Due to this, a divergence of an optical axis of a laser light emitted into the container 17 via the top plate 33 from a later-described laser light irradiating device 34 can be prevented.

The laser light irradiating device 34 is set outside the container 17. The laser light irradiating device 34 comprises a light source 35, a laser light irradiating unit 36, and a scan drive unit 37.

The light source 35 is constituted by a laser oscillation device or the like, and oscillates a laser light having a predetermined wavelength. As a laser light, a light having a wavelength that can be absorbed into silicon which makes up the semiconductor substrate 21 is used. For example, a carbon dioxide laser or a YAG laser is used.

The light source 35 oscillates a spot-like laser light having a power that can excite silicon to a state in which silicon can react with the process gas. The laser light may either be a continuous light or a pulse light. The light source 35 oscillates a laser light having a power of, for example, approximately 300 W.

The laser light irradiating unit 36 is connected to the light source 35 by an optical fiber 38, and functions as an irradiation port from which a laser light is irradiated. The laser light irradiating unit 36 has a shaping unit 36a including a lens and a light shielding unit, and shapes the spot shape (cross-sectional shape) of a laser light to be emitted into a predetermined shape. The spot shape is, for example, a rectangle of 50 µm×150 µm, an oval, or a circle. Here, a rectangle or an oval is preferred to, in order to make cut portions of the semiconductor substrate 21 linear.

The temperature of the optical fiber 38 and laser light irradiating unit 36 is adjusted by an unillustrated temperature adjusting unit. Due to this, the characteristic of a laser light is prevented from changing along with elapse of time due to a rise in the temperature caused by loss of the laser light that passes through the optical fiber 38 and the laser light irradiating unit 36.

The scan drive unit 37 is provided on the outer wall of the container 17 so as to surround the opening 17a. The scan drive unit 37 is constituted by a so-called XYθ stage. The scan drive unit 37 is so designed as to be able to drive the laser light irradiating unit 36 in XY directions with respect to the placement surface of the stage 18 as a reference surface, and also able to drive the laser light irradiating unit 36 to rotate in parallel with the placement surface.

The scan drive unit 37 drives the laser light irradiating unit 36, which is in a state that a laser light will be emitted therefrom approximately vertically onto the surface of the semiconductor substrate 21, in accordance with a predetermined pattern and at a predetermined speed. The scanning speed is set at a speed at which the semiconductor substrate 21 can be cut through all its thickness by irradiation of the laser light.

As described above, the wavelength of a laser light is absorbable by silicon. Therefore, the silicon in the surface of the semiconductor substrate 21 onto which the laser light is irradiated is excited by absorption of the laser light. As will be described later, while a process is carried out, a process gas (such as $SF_6$) having reactivity with silicon is supplied into the container 17. The excited silicon is converted into a predetermined gaseous substance by reacting with the supplied process gas, and disappears from the surface of the semiconductor substrate 21.

That is, the excited silicon (Si) reacts with $SF_6$ and thereby is converted into $SiF_4$. A sulfur component (S) that is separated from $SF_6$ produces $SO_2$ by reacting with $O_2$. Since the pressure inside the container 17 is set to a highly vacuumed state, $SiF_4$ and $SO_2$ exist therein as gases. Accordingly, a part of the semiconductor substrate 21 that is irradiated by the laser light is converted into a gaseous substance. Due to this, a disappearing portion at which a part of the semiconductor substrate 21 has disappeared is formed in the surface area of the semiconductor substrate 21. The gaseous substance produced by the reaction is prevented from being stuck and deposited on the surface of the semiconductor substrate 21, and discharged to the outside of the container 17.

Further, a laser light having a wavelength that is not absorbed by the process gases ($SF_6$ and $O_2$) is used. Therefore, the laser light is prevented from being degenerated by the process gases before reaching the surface of the semiconductor substrate 21, and a change in the characteristic of the laser light is prevented. Further, a damage on the container 17 by the excited process gases can be avoided.

As described above, a disappearing portion is formed in the surface of the semiconductor substrate 21 in response to irradiation of the laser light. Accordingly, by adjusting the power of the laser light, the irradiation time, and the number of pulses to be irradiated, it is possible to apply a predetermined process, in particular, a dividing process to the surface of the semiconductor surface 21 and its neighborhood.

A gate 39 is provided to the side wall of the container 17, and a gate valve 40 that can airtightly open and close the gate 39 is fixed around the gate 39. The gate valve 40 is provided so as to separate the container 17 and the transportation chamber 13 from each other.

The heating chamber 15 is provided for heating the process target 19, which has been cooled to, for example, approximately −50° C. in the process chamber 14, to a room temperature.

Figure 4:
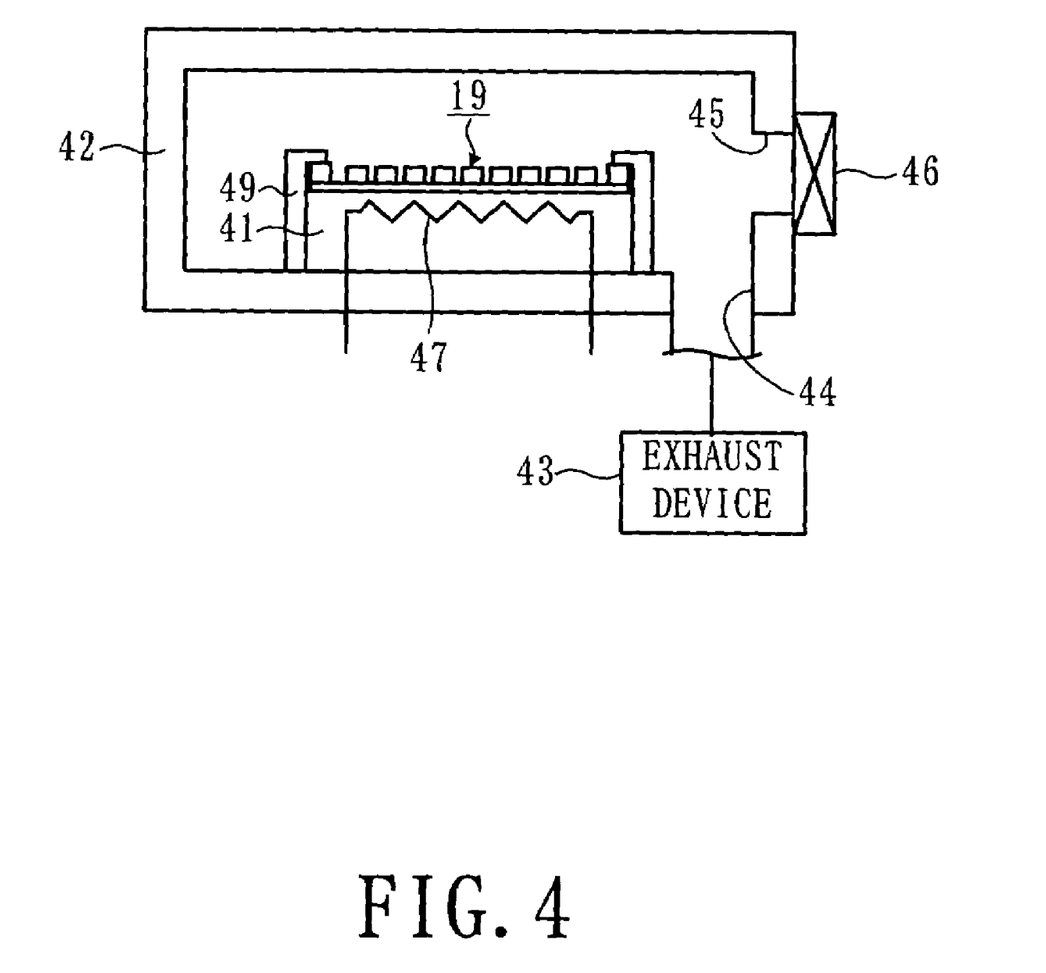
FIG. 4 is a diagram showing the structure of a heating chamber.

The structure of the heating chamber 15 is shown in FIG. 4. As shown in FIG. 4, the heating chamber 15 has a container 42 in which a stage 41 is provided. An exhaust port 44 that is connected to an exhaust device 43 is provided in the bottom of the container 42. The inside of the container 42 is set at a predetermined vacuum pressure by the exhaust device 43.

A gate 45 is provided to the side wall of the container 42, and a gate valve 46 that can airtightly open and close the gate 45 is fixed around the gate 45. The gate valve 46 is provided so as to separate the container 42 and the transportation chamber 13 from each other.

A resistor 47 is embedded in the stage 41, so as to be able to heat the stage 41. The temperature of the stage 41 is set at, for example, approximately 50° C. by the resistor 47. The process target 19 is fixed on the stage 41 by a clamp 49 and is heated. Specifically, the process target 19 is heated to a temperature at which moisture in the air does not cohere when the process target 19 is exposed in the air, for example, to approximately a room temperature or higher than the room temperature.

The heating method employed in the heating chamber 15 is not limited to heating with the use of a resistor, but may be heating with the use of a lamp.

The stage 41 has an unillustrated lift mechanism such as a lift pin, etc., so as to be able to lift and drop the process target 19 on the stage 41.

During heating, dried nitrogen may be supplied to between the process target 19 and the stage 41 or into the container 42 in order to improve thermal conduction.

A substrate processing method employing the processing device 11 having the above-described structure will now be explained with reference to the drawings.

First, a cassette in which unprocessed process targets 19 (semiconductor substrate 21, etc.) are contained is transported into the cassette chamber 12. The transportation mechanism 16 takes out a process target 19 from the cassette in the cassette chamber 12.

After the transportation mechanism 16 takes out the process target 19 from the cassette, a gate valve 48 that connects the transportation chamber 13 and the cassette chamber 12 is closed. Thereafter, the inside of the transportation chamber 13 is depressurized to a predetermined vacuum pressure.

After the transportation chamber 13 is depressurized, the gate valve 40 between the transportation chamber 13 and the process chamber 14 is opened, and the transportation mechanism 16 transports the taken-out process target 19 into the process chamber 14 and hands it over to the unillustrated lift pin. As the lift pin falls, the process target 19 is placed on the stage 18. Needless to say, the process target 19 is placed so that the semiconductor substrate 21 is exposed and the adhesive sheet 22 faces the stage 18.

After the transportation mechanism 16 leaves, the gate valve 40 is closed and the pressure inside the process chamber 14 is set to a predetermined process pressure. The temperature of the stage 18 is previously adjusted to −50° C., by the chiller flowing through the coolant flow passage 24. The placed process target 19 is fixed on the stage 18 by the clamp 20.

After the process target 19 is placed on the optical transparent layer 25 on the stage 18, positioning is performed by the scan drive unit 37. The positioning is performed while an alignment mark provided on the process target 19 is referred to. Due to this, the position of the scan drive unit 37 is adjusted.

Figure 5A:
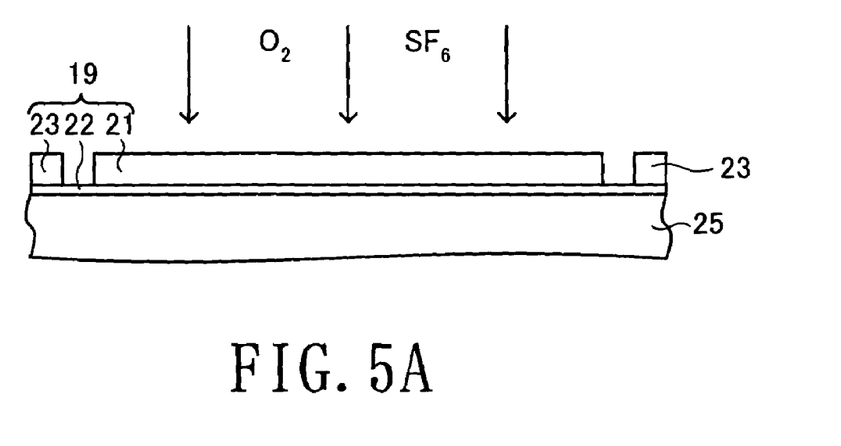
FIGS. 5A, 5B and 5C are diagrams showing the steps of processing a substrate.

Next, supply of the process gas including $SF_6$ and $O_2$ into the container 17 is started. Due to this, the surface of the semiconductor substrate 21 is exposed in the atmosphere of the process gas, as shown in FIG. 5A. At this time, the process gas is supplied in a way that a density sufficient for reaction is achieved at least in the neighborhood of the process target 19.

After the density of the gas in the container 17 becomes almost stable, emission of the laser light from the laser light irradiating unit 36 is started. On the other hand, the scan drive unit 37 moves the laser light irradiating unit 36 in accordance with a predetermined pattern and at a predetermined speed.

At this time, because a wavelength that is not absorbed by $SF_6$ and $O_2$ is selected as the wavelength of the laser light, there occurs almost no loss of the laser light that might be caused by the existence of these gases. This means that it is possible to avoid any damages on the non-target portions (portions that are not the target of laser light irradiation) of the semiconductor substrate 21 and on the inside of the container 17 that might be caused by expansion of the gases which are excited in the passages through which the laser light passes.

The silicon which exists in the surface area of the semiconductor substrate 21 and onto which the laser light is irradiated is excited. The excited silicon atoms and cluster silicon react with the process gas to be converted into a gaseous substance.

Figure 5B:
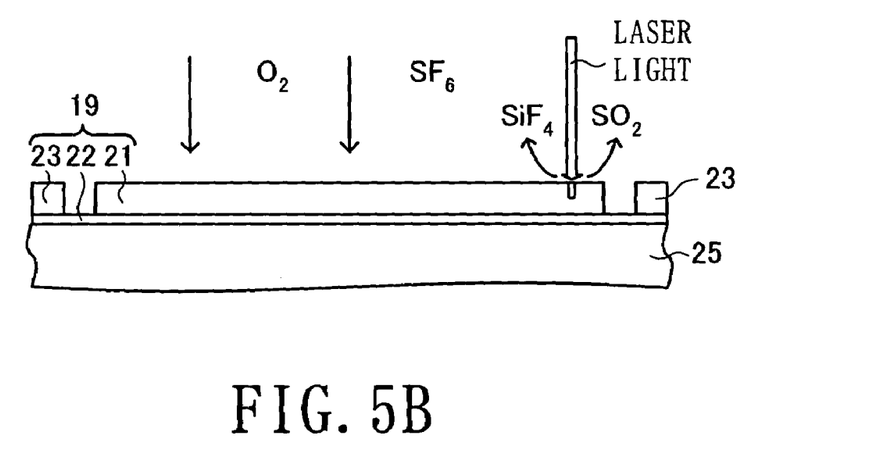

That is, silicon (Si) is converted into gaseous $SiF_4$ by reacting with $SiF_6$. The sulfur component (S) that is separated from $SF_6$ reacts with $O_2$ to produce $SO_2$, etc. The inside of the chamber is set to be a highly vacuumed state, and $SiF_4$ and $SO_2$, etc. exists as gases. In this way, the portions of the semiconductor substrate 21 onto which the laser light is irradiated are converted into the gaseous substance, and thus disappearing portions are formed (FIG. 5B).

As described above, because the removed silicon is converted into the gaseous substance, after-process refuse is prevented from being stuck and deposited on the surface of the semiconductor substrate 21. Because of this, unlike a case where a cutting process is applied to a substrate with the use of a dicing saw, the mechanical structure exposed on the surface of the semiconductor substrate 21 and its function can be protected from being damaged by after-process refuse such as cutting dust.

Further, because after-process refuse does not stick to the surface, there is substantially no need of cleansing the process target 19. Therefore, damage on the mechanical structure caused by pure water flow occurring in cleansing, and damage on the function of the mechanical structure due to cohesion by surface tension of pure water, can be avoided.

Furthermore, the heat of the process target portions onto which the laser light is irradiated is absorbed by the chiller flowing through the coolant flow passage 24 provided inside the stage 18. Because the heat generating portions are not cooled directly by pure water, the above-described damage on the mechanical structure and on its function can be avoided.

In the way described above, the portions of the semiconductor substrate 21 onto which the laser light is irraidated are removed. The disappearing portions are formed linearly from one surface of the semiconductor substrate 21 through the other surface thereof due to the characteristic of the laser light. That is, the disappearing portions are formed as holes extending in the direction approximately vertical to the surfaces. In accordance with the scan drive unit 37, the laser light irradiating unit 36 moves at a speed at which a hole is formed through all the thickness of the semiconductor substrate 21. Preferably, the scanning speed of the laser light is set slightly slower than a speed necessary for cutting the semiconductor substrate 21 through all its thickness, in consideration of the margin for possible unevenness of the thickness of the semiconductor substrate 21. That is, the scanning speed of the laser light is set such that the semiconductor substrate 21 is overcut.

Figure 6:
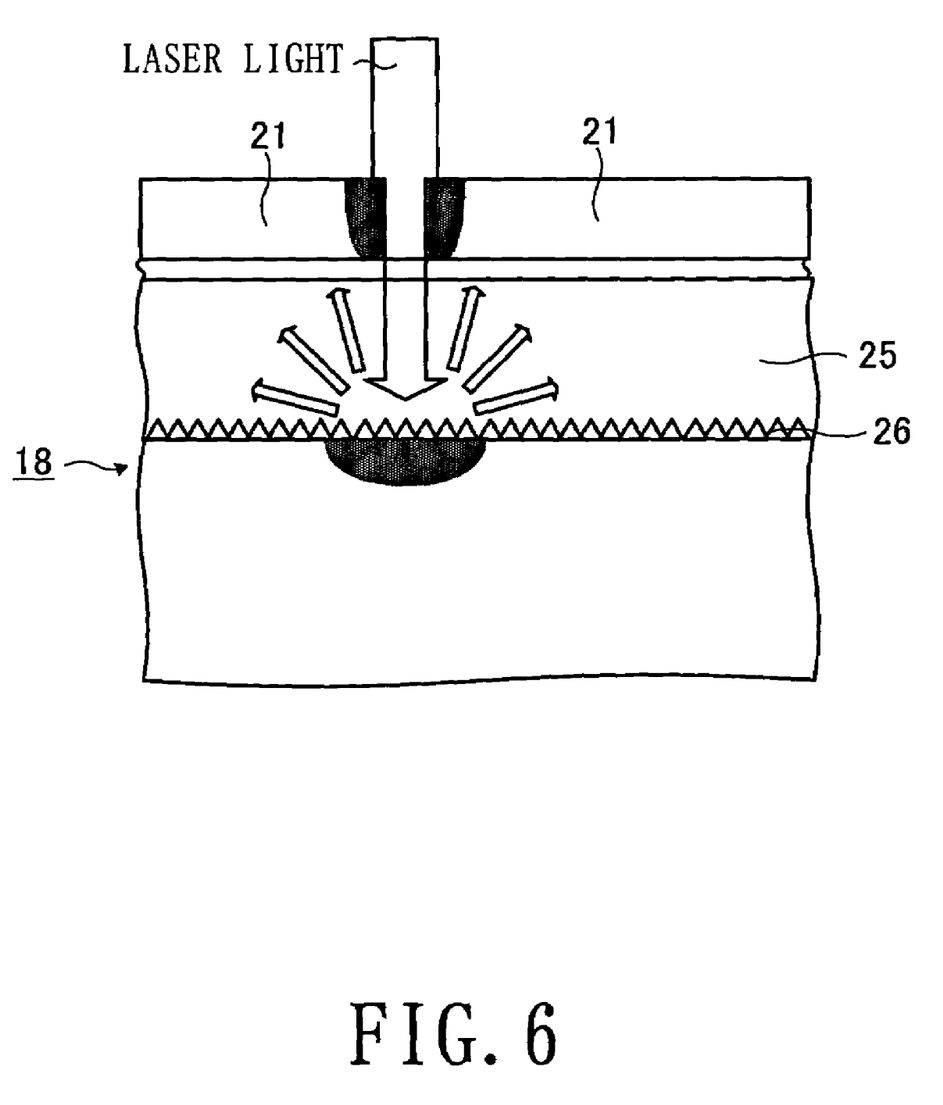
FIG. 6 is a diagram showing a state of a laser light when a substrate is divided.

If the laser light is irradiated so that the semiconductor substrate is overcut, there may occur a case where the laser light continues to be irradiated even after the silicon is completely removed, as shown in FIG. 6. The adhesive sheet 22 does not absorb the laser light, and let the laser light pass therethrough without the adhesive sheet 22 being cut.

The laser light that passes through the adhesive sheet 22 comes to the optical transparent layer 25 placed under the adhesive sheet 22. Because the optical transparent layer 25 does not absorb the light and let it through, the portion where the adhesive sheet 22 and the optical transparent layer 25 contact does not become a high temperature. Because of this, it is possible to avoid denaturation of the adhesive sheet 22 by heat, which is due to that the adhesive sheet 22 is sandwiched between the high-temperature portions (the hatched portions in FIG. 6) of the semiconductor substrate 22 and the stage 18.

Further, the light scattering portion 26 is provided under the optical transparent layer 25 which is provided at the upper portion of the stage 18. Therefore, the laser light that has passed through the optical transparent layer 25 is scattered by the light scattering portion 26, and irradiated onto the body of the process target 19 and the stage 18. Therefore, the portions of the stage 18 that are irradiated by the laser light are prevented from being overheated.

Figure 5C:
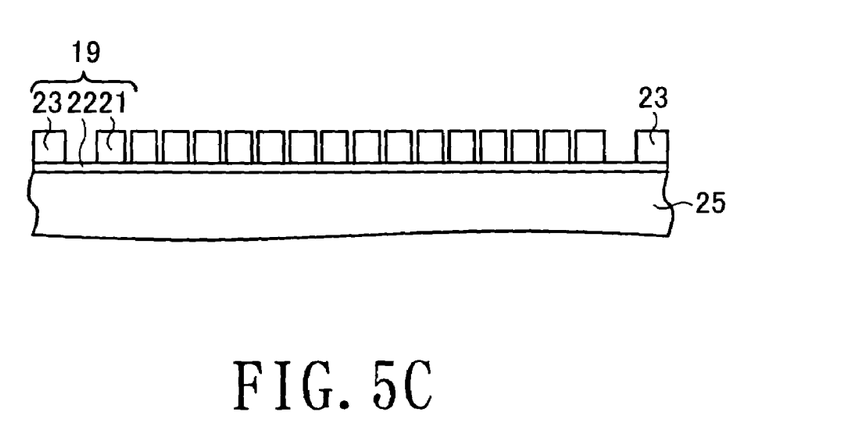

The scan drive unit 37 drives the laser light irradiating unit 36 in accordance with a predetermined pattern. Therefore, the laser light is irradiated onto the surface of the semiconductor substrate 21 in accordance with the predetermined pattern. The above-described silicon conversion (decomposition) reaction progresses at the portions onto which the laser light is irradiated, and the semiconductor substrate 21 is divided into multiple portions. After dividing of the entire semiconductor substrate 21 is completed, irradiation of the laser light is stopped, and supply of the process gas is stopped. In this way, the process target 19 being in a state shown in FIG. 5C where the semiconductor substrate 21, which is divided into a plurality of portions in accordance with a predetermined pattern, is adhered to the adhesive sheet 22, is obtained.

After this, supply of an inert gas, for example, a nitrogen gas, is started. Due to this, the process gas, etc. in the container 17 is purged. The purge is conducted for a time period sufficient for removing the process gas and gases of substances originating from the reaction in the container 17.

After the purge is finished, the clamp 20 is elevated, and the unillustrated lift pin lifts up the process target 19 from the stage 18. In the meantime, the gate valve 40 is opened, and the transportation mechanism 16 transports the process target 19 from the process chamber 14 to the transportation chamber 13. The process target 19 is transported out, the gate valve 40 is closed.

Then, the gate valve 46 between the heating chamber 15 and the transportation chamber 13 is opened. The transportation mechanism 16 transports the process target 19 into the heating chamber 15, and the process target 19 is placed on the stage 41 by the unillustrated lift mechanism.

The temperature of the stage 41 in the heating chamber 15 is adjusted to, for example, approximately 50° C., by the resistor 47. In order to improve the thermal conduction, dried nitrogen may be supplied into the heating chamber 15. The heating process is finished at the time when the semiconductor substrate 21 is sufficiently heated to a temperature (equal to or higher than the room temperature) at which cohesion of moisture does not occur if the semiconductor substrate 21 is exposed in the air. The process target 19, which has been subjected to the heating process, is transported from the heating chamber 15 to the transportation chamber 13 by the unillustrated lift mechanism and the transportation mechanism 16.

Next, dried air or the like is supplied into the transportation chamber 13, and the pressure in the transportation chamber 13 rises to the atmospheric pressure. After this, the gate valve 48 between the transportation chamber 13 and the cassette chamber 12 is opened. The transportation mechanism 16 transports the process target 19 to the cassette. Thus, the entire process that should be applied to one process target 19 is finished.

The present invention is not limited to the above-described embodiment, but may be variously modified and applied. A modification of the above-described embodiment that can be applied to the present invention will now be explained.

In the above-described embodiment, a case where the semiconductor substrate 21 is cut through all its thickness, has been explained. However, the present invention is not limited to this case, but can be suitably applied to a case where grooves having a predetermined depth are to be formed in order to divide the surface of a substrate into a plurality of areas.

In the above-described embodiment, $SF_6$ and $O_2$ are used as the process gases. However, the kinds of gases are not limited to those. For example, instead of $SF_6$, fluoride gases such as $NF_3$, $F_2$, $CF_4$, $C_2F_6$, etc. or chloride gases such as $Cl_2$, $BCl_4$, etc. can be used. Further, instead of $O_2$, oxide gases such as $O_3$, $NO_2$, $N_2O$, $H_2O$, CO, etc. can be used. That is, any substances can be used as long as they are highly reactive with silicon and are able to produce a gaseous substance by the reaction.

In the above-described embodiment, the only one laser light irradiating unit 36 is provided. However, a divider which divides the laser light from the light source 35 may be provided, and at the same time, a plurality of laser light irradiating units may be provided. Then, the laser light divided by the divider may be irradiated onto a plurality of portions on the surface of the semiconductor substrate 21 via the plurality of laser light irradiating units.

In the above-described embodiment, the circumference of the optical transparent layer 25 may be covered with a material that does not permit transmission of light. In this case, light that is scattered by the light scattering portion 26 is prevented from coming into the container 17.

Further, in the above-described embodiment, a thermal conductive gas may be supplied near the placement surface of the stage 18 set in the process chamber 14, in order to improve the thermal conduction efficiency between the process target 19 and the stage 18.

The optical transparent layer 25 may not be provided. However, this is not preferable because the top surface of the stage 18 is directly heated.

A light absorptive material or an elastic material having thermal conductivity, etc. may be provided under the optical transparent layer 25.

In the above-described embodiment, only the process gas is supplied when the process is performed. However, a down flow of an inert gas may be formed in the container 17 and in particular, around the stage 18, so that discharging of the gaseous substance produced by reaction can be promoted during the process.

In the above-described embodiment, a case where a process is applied to a silicon semiconductor substrate having an MEMS element, has been explained. However, the present invention can be applied to processing of a substrate on which an element other than an MEMS element is formed. Particularly, the present invention can be suitably applied to processing of a substrate having a fine structure formed on its surface.

The semiconductor substrate 21 may be made of not only silicon, but also a silicon-containing material such as SiGe. Further, the semiconductor substrate 21 is not limited to a silicon-containing material, but may be made of a compound material including other materials such as GaP, InP, etc. Further, the so-called SOI (Silicon On Insulator) in which the above-listed semiconductor materials and an insulating material are deposited can be used.

The present invention can be suitably applied not only to processing of a semiconductor substrate, but also to processing of other substrates such as a glass substrate, etc.

The substrate to be processed may be made up of the various materials described above. However, note that a laser light that is in the range of a wavelength that can be absorbed by each material is used in the process. Further, note that a substance that has reactivity with a material excited by the laser light, and that can produce a gaseous material under the process pressure is used as the process gas.

Furthermore, in a case where the substrate to be processed is made up of plural kinds of materials as described above, plural kinds of laser lights having different wavelengths may be used.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2002-257200 filed on Sep. 2, 2002 and including specification, claims, drawings and summary. The disclosure of the above Japanese Patent Application is incorporated herein by reference in its entirety.

What is claimed is:

1. A substrate processing device, comprising:
   a chamber;
   a stage which is provided in said chamber and on which a substrate is placed;

a process gas supplier which supplies into said chamber a process gas which reacts with a material of the substrate and thus can convert the material into a gaseous substance; and a laser light irradiator which includes a light source oscillating a laser light having a predetermined wavelength that is absorbable by the material and not absorbable by the process gas and a light irradiating unit connected to said light source, said laser light being irradiated to a predetermined portion of the substrate and being prevented from changing during passing through a transferring path from said light source to said light irradiating unit, without being degenerated by the process gas, so that the material at said predetermined portion is excited and then converted into the gaseous substance by reacting with the process gas.

2. The substrate processing device according to claim 1, further comprising a pressure adjuster provided to a wall of said chamber which adjusts a pressure inside said chamber to a pressure at which the gaseous substance can exist as a gas.

3. The substrate processing device according to claim 2, wherein said stage comprises a temperature adjuster which adjusts a temperature of the substrate at a predetermined temperature.

4. The substrate processing device according to claim 3, wherein the process gas is made up of a substance that does not absorb the laser light having the predetermined wavelength.

5. A substrate processing device according to claim 1, wherein said laser light irradiator further includes a temperature adjusting unit, which adjusts the temperature of said laser light irradiator to prevent the laser light from changing.

6. A substrate processing device, comprising:
a chamber;
a stage which is provided in said chamber and on which a substrate is placed, said stage comprising a temperature adjuster which adjusts a temperature of the substrate at a predetermined temperature;
a process gas supplier which supplies into said chamber, a process gas which reacts with a material of the substrate and thus can convert the material into a gaseous substance, wherein the process gas is made up of a substance that does not absorb the laser light having the predetermined wavelength;
a laser light irradiator which irradiates a laser light emitted from a light source having a predetermined wavelength that is absorbable by the material and not absorbable by the process gas, said laser light being irradiated to a predetermined portion of the substrate and being prevented from changing during passing through a transferring path from said light source to said light irradiating unit, without being degenerated by the process gas so that the material at said predetermined portion is excited and then converted into the gaseous substance by reacting with the process gas;
a pressure adjuster which adjusts a pressure inside said chamber to a pressure at which the gaseous substance can exist as a gas; and
an inert gas supplier which supplies an inert gas into said chamber.

7. A substrate processing device, comprising:
a chamber;
a stage which is provided in said chamber and on which a substrate is placed, said stage comprising a tempera-ture adjuster which adjusts a temperature of the substrate at a predetermined temperature, wherein said stage comprises an optical transparent layer which constitutes a placement surface on which the substrate is placed, and which permits transmission of light;
a process gas supplier which supplies into said chamber, a process gas which reacts with a material of the substrate and thus can convert the material into a gaseous substance, wherein the process gas is made up of a substance that does not absorb the laser light having the predetermined wavelength;
a laser light irradiator which irradiates a laser light having a predetermined wavelength to a predetermined portion of the substrate so that the material at said predetermined portion is excited and then converted into the gaseous substance by reacting with the process gas;
a pressure adjuster which adjusts a pressure inside said chamber to a pressure at which the gaseous substance can exist as a gas; and
an inert gas supplier which supplies an inert gas into said chamber.

8. The substrate processing device according to claim 7, wherein a light scattering layer that can scatter the laser light is provided in an area of said stage where said optical transparent layer is provided.

9. The substrate processing device according to claim 8, wherein:
said chamber comprises a window constituted by a window member that permits transmission of the laser light; and
said laser light irradiator irradiates the laser light onto the substrate through said window from the outside of said chamber.

10. The substrate processing device according to claim 9, further comprising a temperature adjuster which adjusts a temperature of the window material to a predetermined temperature.

11. The substrate processing device according to claim 10, wherein said laser light irradiator comprises:
a light source which oscillates the laser light having the predetermined wavelength;
a laser light irradiating terminal which is connected to said light source and irradiates the laser light; and
a drive unit which drives said laser light irradiating terminal in accordance with a predetermined pattern.

12. The substrate processing device according to claim 11, wherein said laser light irradiator irradiates the laser light having a spot shape.

13. The substrate processing device according to claim 12, wherein said laser light irradiator comprises a shaping unit which can shape the spot shape of the laser light.

14. The substrate processing device according to claim 13, wherein said shaping unit shapes the spot-shaped laser light into an oval or a rectangle.

15. The substrate processing device according to claim 14, wherein the substrate is supported by its surface that faces said stage being adhered to a sheet material.

16. The substrate processing device according to claim 15, wherein the substrate is made up of a semiconductor material.

17. The substrate processing device according to claim 16, further comprising:
a transportation chamber which is connected to said chamber via a gate member that can be airtightly opened and closed, and which comprises a transportation device for transporting the substrate into and out from said chamber; and a heating chamber which is connected to said transportation chamber and is provided for heating the substrate transported out from said chamber to a predetermined temperature.

18. A substrate processing method, comprising:
   placing a substrate in a chamber;
   supplying into the chamber a process gas that reacts with a material of the substrate and thus can convert the material into a gaseous substance; and
   irradiating a laser light having a predetermined wavelength that is absorbable by the material and not absorbable by the process gas, said laser light being irradiated to a predetermined portion of the substrate, and being prevented from changing during passing through a transferring path from said light source to said light irradiating unit, without being degenerated by the process gas, so that the material at the predetermined portion is excited and converted into the gaseous substance by reacting with the process gas.

19. The substrate processing method according to claim 18, further comprising adjusting a pressure inside the chamber with an adjuster provided to a wall of the chamber to a pressure at which the gaseous substance can exist as a gas.

20. The substrate processing method according to claim 19, further comprising adjusting a temperature of the substrate to a predetermined temperature.

21. The substrate processing method according to claim 20, wherein in said laser light irradiating step, the laser light is irradiated from the outside of the chamber.

22. A substrate processing method, comprising:
   placing a substrate in a chamber;
   supplying into the chamber a process gas that reacts with a material of the substrate and thus can convert the material into a gaseous substance;
   irradiating a laser light having a predetermined wavelength onto a predetermined portion of the substrate, so that the material at the predetermined portion is excited and converted into the gaseous substance by reacting with the process gas;
   adjusting a pressure inside the chamber to a pressure at which the gaseous substance can exist as a gas;
   adjusting a temperature of the substrate to a predetermined temperature;
   wherein in said laser light irradiating step, the laser light is irradiated from the outside of the chamber; and
   wherein said laser light irradiating step comprises moving a position that the laser light should irradiate in accordance with a predetermined pattern.

23. The substrate processing method according to claim 22, wherein in said laser light irradiating step, a spot-shaped laser light having a spot shape which is shaped into an oval or a rectangle is irradiated.

24. The substrate processing method according to claim 23, further comprising supplying an inert gas into the chamber.

25. The substrate processing method according to claim 24, wherein in said laser light irradiating step, at least a surface area of the substrate is divided into a plurality of areas.

26. The substrate processing method according to claim 25, wherein in said laser light irradiating step, the substrate is divided into a plurality of parts.

* * * * *